(12) United States Patent
Moriyama et al.

(10) Patent No.: US 7,256,584 B2
(45) Date of Patent: *Aug. 14, 2007

(54) METHOD AND SYSTEM FOR MEASURING PARTIAL DISCHARGE

(75) Inventors: Tomohiro Moriyama, Hitachi (JP); Tatsuro Kato, Hitachi (JP); Toshiaki Rokunohe, Hitachinaka (JP); Fumihiro Endo, Hitachi (JP); Ryoichi Shinohara, Hitachinaka (JP)

(73) Assignee: Japan AE Power Systems Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/294,409

(22) Filed: Dec. 6, 2005

(65) Prior Publication Data

US 2006/0071667 A1    Apr. 6, 2006

Related U.S. Application Data

(63) Continuation of application No. 11/048,777, filed on Feb. 3, 2005, now abandoned.

(30) Foreign Application Priority Data

Feb. 20, 2004    (JP) .............................. 2004-044928

(51) Int. Cl.
*G01R 31/12* (2006.01)
(52) U.S. Cl. ..................................... 324/536
(58) Field of Classification Search ................. 324/536
See application file for complete search history.

(56) References Cited

U.S. PATENT DOCUMENTS 5,642,038 A * 6/1997 Kim et al. ............... 324/76.19
6,114,871 A * 9/2000 Shiota et al. ............... 324/772
2001/0040459 A1   11/2001 Kato et al.

FOREIGN PATENT DOCUMENTS

| DE | 41 26 868 A1 | 2/1993 |
|---|---|---|
| DE | 196 47 686 A1 | 5/1998 |
| EP | 0 488 719 A2 | 6/1992 |
| JP | 09-080111 | 3/1997 |
| JP | 10-170596 | 6/1998 |

OTHER PUBLICATIONS

European Search Report of EP Appln. No. 05 002 312.6.
Nishiguchi, K. et al., "Single-Electron Transistors with Two Self-Aligned Gates"; Extended Abstracts of the 2000 International Conference on Solid State Devices and Materials; Sendai, 2000, pp. 116-117.

* cited by examiner

*Primary Examiner*—Vincent Q. Nguyen
(74) *Attorney, Agent, or Firm*—Mattingly, Stanger, Malur & Brundidge PC

(57) ABSTRACT

In the measurement of partial discharge, a voltage detected by an antenna is input to a spectrum analyzer and a phase difference between an operating voltage and a power supply of the spectrum analyzer is obtained by phase domain analysis using the spectrum analyzer. Based on the phase difference and the voltage phase shift associated with the input impedance of a signal converter circuit, the time axis displayed on the screen of the spectrum analyzer is compensated. After the compensation has been carried out, the voltage detected by the antenna is input into the spectrum analyzer and the partial discharge pattern which synchronizes with the operating voltage is measured by phase domain analysis using the spectrum analyzer.

10 Claims, 3 Drawing Sheets

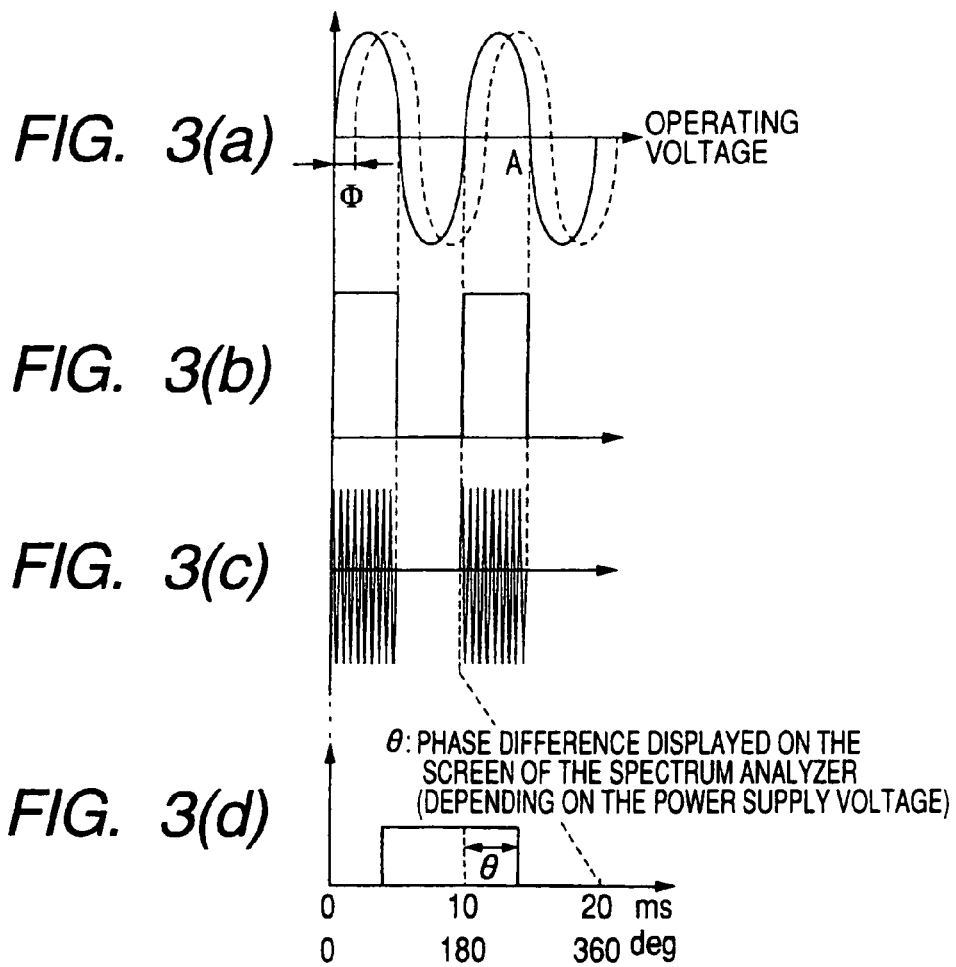
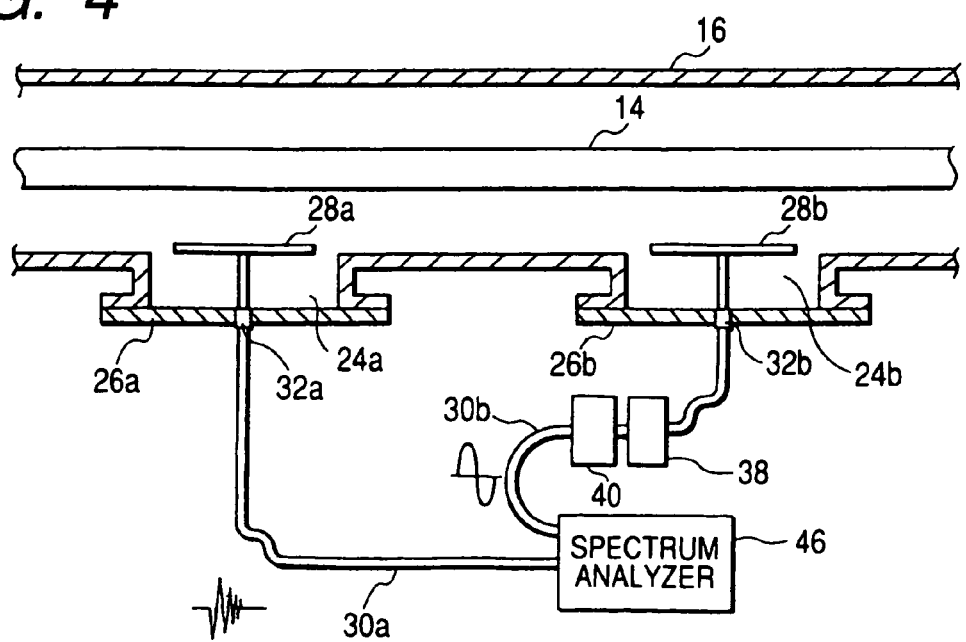

METHOD AND SYSTEM FOR MEASURING PARTIAL DISCHARGE

This is a continuation application of U.S. Ser. No. 11/048,777, filed Feb. 3, 2005 now abandoned.

CLAIM OF PRIORITY

The present application claims priority from Japanese application serial no. 2004-44926, filed on Feb. 20, 2004, the content of which is hereby incorporated by reference into this application.

FIELD OF THE INVENTION

The present invention relates to a partial discharge measurement method and a system, and specifically to a partial discharge measurement method and a system suitable for measuring partial discharge which results from an insulation defect in a container filled with insulating gas used as an insulation material.

BACKGROUND OF THE INVENTION

The gas insulated device, such as a gas circuit breaker, gas insulated switchgear and gas insulated bus, which is used in a transmission and delivery system is structured such that a high-voltage conductor is encased in a sealed metal container filled with an insulating gas and is supported by an insulating support medium. If a defect, such as a metal particle, is present in the sealed metal container, a high electric field is formed locally at the tip of the particle, causing a partial discharge to occur. If the partial discharge continues to exist, mechanical deterioration inside the device may occur, which may eventually result in a breakdown. In view of such circumstances, to conduct preventive maintenance of gas insulated devices, early detection of partial discharge which indicates a preliminary breakdown is important.

When detecting partial discharge, a specific pattern of the partial discharge signal is developed, and based on the pattern, the type of defect is identified. In this case, the pattern of the partial discharge signal depends on the phase of the rated voltage applied to a high-voltage conductor, for example, an alternating voltage (operating voltage) of 60,000 to 500,000 volts (50/60 Hz). Therefore, the operating voltage is synchronized with the partial discharge signal (see Japanese Patent Laid-Open No. Hei 09(1997)-80111).

SUMMARY OF THE INVENTION

Conventionally, when detecting a partial discharge signal in a signal processing section using an alternating voltage (operating voltage) as a trigger, the alternating voltage is separated from the partial discharge signal which has superposed on the alternating voltage in the signal detecting section; however, there is no consideration about the fact that the phase of the signal changes depending on the elements that configure the signal detecting section. Accordingly, if the signal which has had its phase changed is processed in the signal processing section, even if a partial discharge signal is detected by using an alternating voltage (operating voltage) as a trigger, it is difficult to detect an accurate pattern of the partial discharge signal.

The objective of the present invention is to compensate a phase shift prior to the measurement of partial discharge when there is a phase shift in the measurement system where partial discharge is to be measured.

To achieve the above objective, when measuring partial discharge by using a measuring instrument which displays input information on its screen, the present invention detects voltages of the conductor encased in the container; converts the waveform of the operating voltage (alternating voltage), among detected voltages, applied to the conductor by using a signal converter circuit; inputs the converted operating voltage into the measuring instrument; detects the phase difference between the measuring instrument's power-supply voltage and the operating voltage based on the inputted operating voltage; compensates the phase of the time axis displayed on the measuring instrument's screen according to the detected phase difference; and inputs the detected voltage into the compensated measuring instrument as it is, thereby displaying partial discharge information on the measuring instrument's screen. In this case, if there is a voltage phase shift associated with input impedance of the signal converter circuit, it is possible to further accurately compensate phase shifts by considering the voltage phase shift and compensating the phase of the time axis displayed on the screen of the measuring instrument.

According to the present invention, partial discharge can be accurately measured.

BRIEF DESCRIPTION OF DRAWINGS

FIG. 3 shows waveforms taken at various portions of the signal converter circuit and the display screen of the spectrum analyzer.

FIG. 4 is a block diagram of a partial discharge measuring device according to a second embodiment of the present invention.

DESCRIPTION OF THE PREFERRED EMBODIMENTS

Figure 1:
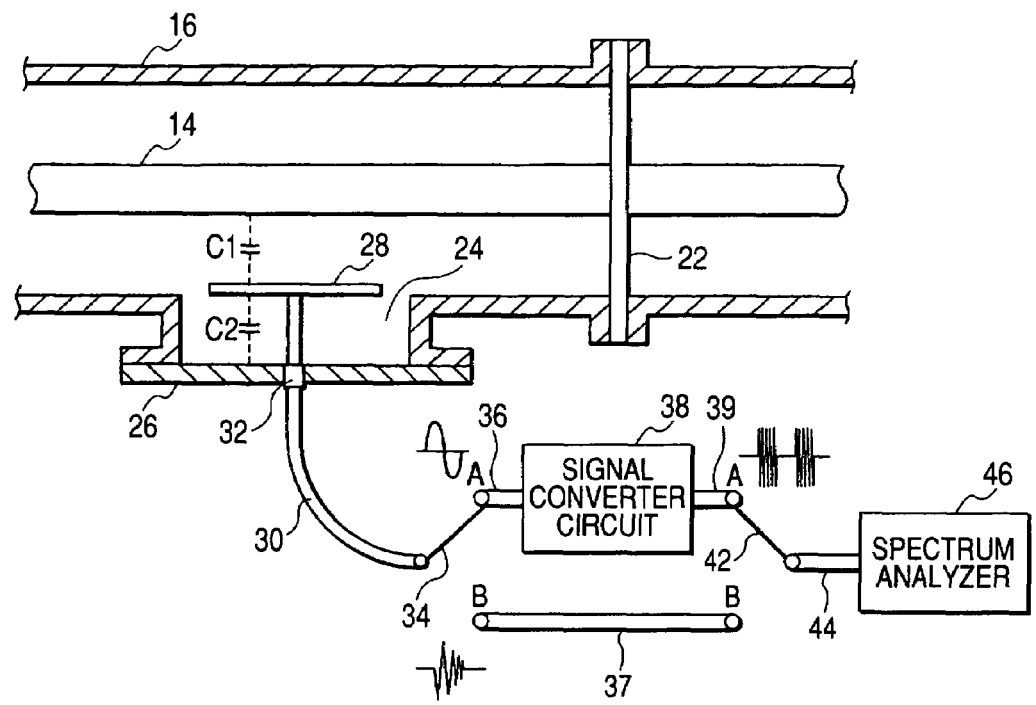
FIG. 1 is a block diagram of a partial discharge measuring device according to a first embodiment of the present invention.

Hereafter, an embodiment of the present invention will be explained with reference to the drawings. FIG. 1 is a block diagram of a partial discharge measuring device according to a first embodiment of the present invention, and FIG. 2 is a side cross-sectional view of the major portion when the partial discharge measuring device is installed in an gas insulated device.

Figure 2:
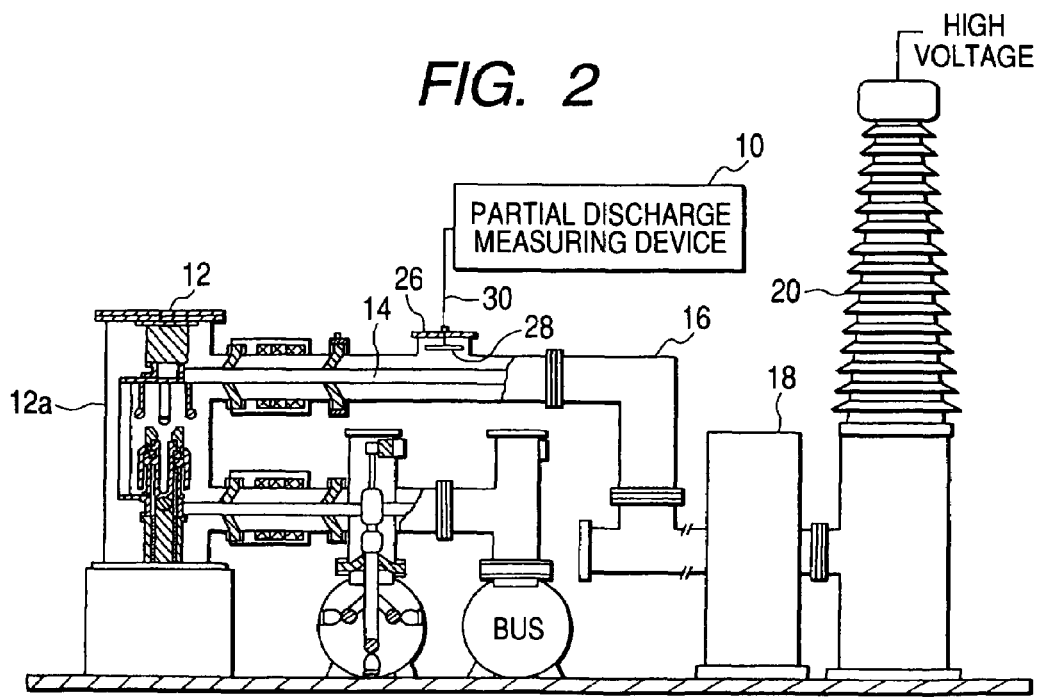
FIG. 2 is a side cross-sectional view of the major portion when the partial discharge measuring device is installed in the gas insulated device.

In FIGS. 1 and 2, the partial discharge measuring device 10 is installed in the vicinity of the metal container 16, which encases a high-voltage conductor 14 and an insulation material, so as to measure one phase of the high-voltage conductor 14 which is a gas insulated bus connected to a gas circuit breaker 12. One end of the high-voltage conductor 14 is connected to an electrode of the gas circuit breaker 12, and the other end is exposed to the atmosphere via an arrester 18 and a bushing 20. For example, 60,000 to 500,000 volt alternating voltage is applied to the high-voltage conductor 14 as an operating voltage. The high-voltage conductor 14 is supported by an annular insulating support medium 22, and the insulating support medium is fixed to the metal container 16. The metal container 16 is cylindrically structured, and one end in the axial direction is connected to the switchgear encasing container 12*a* which encases the gas circuit breaker (gas insulated switchgear) 12. In this metal container 16, as an insulation material, for example, a gas or a gas mixture consisting of a main gas and at least one sub gas is sealed under high pressure. A hand hole 24 is created in the body of the metal container 16, and a flange 26 is mounted at the bottom of the hand hole 24 so as to close the hand hole 24 and seal the metal container 16.

A circular-disc antenna 28 is contained in the hand hole 24 as a voltage sensor, and a coaxial cable 30 is connected to the central portion of the antenna 28. The coaxial cable 30 is exposed to the atmosphere from the metal container 16 via a sealed terminal 32 provided on the flange 26. When detecting an operating voltage (alternating voltage) applied to the high-voltage conductor 14 and a partial discharge signal which has superposed on the operating voltage, the antenna 28 uses a floating capacitor C1 located between the antenna 28 and the high-voltage conductor 14 and another floating capacitor C2 located between the antenna 28 and the flange 26 and detects the voltage electrostatically divided by the floating capacitors C1 and C2, and then outputs the detected voltage to the coaxial cable 30. The other end of the coaxial cable 30 in the axial direction is connected to the changeover switch 34 which can switch between the A-side and the B-side. The A-side of the changeover switch 34 is connected to a coaxial cable 36 and the B-side of the changeover switch 34 is connected to a coaxial cable 37. The coaxial cable 36 is connected to a coaxial cable 39 via a signal converter circuit 38. The coaxial cable 39 is connected to the A-side of the changeover switch 42, and the coaxial cable 37 is connected to the B-side of the changeover switch 42. The changeover switch 42 can switch between the A-side and the B-side and is connected to a spectrum analyzer 46 via a coaxial cable 44.

The spectrum analyzer 46 is configured as a measuring instrument which displays input information on its screen. The spectrum analyzer 46 has frequency domain analysis and phase domain analysis functions. It is possible to obtain the position of the zero cross of the operating voltage displayed on the screen by carrying out phase domain analysis using a spectrum analyzer 46 by setting the integral multiple of the operating voltage cycle (50/60 Hz) as a horizontal axis.

However, the time axis displayed on the screen of the spectrum analyzer 46 in the phase domain analysis usually synchronizes with the phase of the power supply (outlet power supply) of the spectrum analyzer 46. Accordingly, if there is a phase difference between an operating voltage applied to the high-voltage conductor 14 and a power supply voltage of the spectrum analyzer 46, it is not possible to accurately detect the zero cross of the operating voltage.

Therefore, prior to the measurement of the partial discharge signal using a spectrum analyzer 46, in order to measure the phase difference between an operating voltage of the high-voltage conductor 14 and a power supply voltage of the spectrum analyzer 46, changeover switches 34 and 42 are switched to the A-side, and the voltage detected by the antenna 28 is inputted into a signal converter circuit 38 via a coaxial cable 30, changeover switch 34, and a coaxial cable 36. The signal converter circuit 38 has a function which converts the signal detected by the antenna 28 into a square-wave which has a steep and constant gradient at the zero cross of the operating voltage.

Specifically, the signal converter circuit 38 is equipped with a comparator (not shown) which responds to an operating voltage detected by the antenna 28 and converts the waveform of the operating voltage into a square-wave as shown in FIG. 3(*a*), a half-wave rectification circuit (not shown) which half-wave rectifies the square-wave outputted by the comparator as shown in FIG. 3(*b*), and an oscillation circuit (not shown) which converts the voltage outputted by the half-wave rectification circuit into a voltage of any frequency higher than the operating voltage as shown in FIG. 3(*c*). Herein, the above-mentioned arbitrary frequency component can be detected by the spectrum analyzer 46, and preferably, the frequency component is different from a frequency component contained in the partial discharge electromagnetic wave. The signal converter circuit 38 responds to an operating voltage detected by an antenna 28, creates a square-wave signal which has a steep and constant gradient at the zero cross of the operating voltage, and can convert the square-wave signal into a signal of higher frequency than that of the operating voltage, and outputs the signal. When a signal outputted by the signal converter circuit 38 is inputted into the spectrum analyzer 46, the spectrum analyzer 46 carries out phase domain analysis of the inputted signal. In this case, phase domain analysis of the frequency which is identical to the oscillation frequency of the signal converter circuit 38 is executed. Once the phase domain analysis is done, as shown in FIG. 3(*d*), it is possible to accurately detect the phase difference θ between an operating voltage and a power supply voltage of the spectrum analyzer 46.

On the other hand, as shown in FIG. 3(*a*), because input impedance of the comparator in the signal converter circuit 38 is high (several MΩ), there is a voltage phase shift (phase difference) Φ between the input and output voltages of the comparator. For this reason, when compensating the time axis displayed on the screen of the spectrum analyzer 46, the location of the time axis displayed on the screen of the spectrum analyzer 46 is automatically compensated based on the voltage phase shift (phase difference), Φ associated with input impedance of the comparator and the phase difference θ between the operating voltage and the power supply voltage of the spectrum analyzer 46 so that both the phase difference Φ and the phase difference θ become 0. By carrying out compensation in such a way, it is possible to accurately synchronize the time axis displayed on the screen with the phase of the power supply voltage of the spectrum analyzer 46 in the phase domain analysis of the spectrum analyzer 46.

After the phase compensation has been carried out, changeover switches 34 and 42 are switched to the B-side to measure partial discharge, and the voltage detected by the antenna 28 is inputted into the spectrum analyzer 46 via a coaxial cable 30, changeover switch 34, coaxial cable 37, changeover switch 42, and a coaxial cable 44. If frequency domain analysis is conducted by the spectrum analyzer 46 when voltage detected by the antenna 28 is inputted into the spectrum analyzer 46 without passing through the signal converter circuit 38, the screen is displayed on which the horizontal axis indicates frequency and the vertical axis indicates signal intensity. An image which shows peak frequency in the area where partial discharge has occurred appears on the screen. By executing phase domain analysis with frequency which shows the peak, it is possible to detect a partial discharge pattern which synchronizes with the operating voltage, thereby making it possible to identify the type of defect based on the pattern.

Thus, in this embodiment, prior to the measurement of partial discharge by using a spectrum analyzer 46, if there are voltage phase shifts, which are phase differences θ and Φ, in the measurement system, the voltage phases are compensated so that the phase difference becomes 0. As a result, it is possible to accurately measure partial discharge.

If voltage induced in an antenna 28 is weak, it is preferable to use an amplifier to amplify the signal detected by the antenna 28. Also, a dipole-type antenna can be used as the antenna 28. In this case, among dipole-type antennas, if a half-wave length dipole antenna in which the antenna length is principally equivalent to the half-wave length of the detected electromagnetic wave is used, the partial discharge electromagnetic wave resonates or almost resonates with the antenna, thereby making it possible to effectively detect electromagnetic waves.

Next, a second embodiment of the present invention will be explained with reference to FIG. 4. In this embodiment, antennas 28a and 28b which have the same function as an antenna 28 are encased in hand holes 24a and 24b, respectively, and each antenna 28a and 28b is connected to a spectrum analyzer 46 via a coaxial cable 30a or 30b, and a signal converter circuit 38 and a delay circuit 40 are inserted in the middle of the coaxial cable 30b. The other configuration is the same as that shown in FIG. 1. To equalize the propagation time of each signal that is transmitted through coaxial cables 30a and 30b, the lengths of the coaxial cables 30a and 30b are the same.

The antenna 28a functions as a voltage sensor to detect partial discharge, and the antenna 28b functions as a voltage sensor to detect an operating voltage applied to the high-voltage conductor 14. The operating voltage signal detected by the antenna 28b is formed into a waveform by a signal converter circuit 38, and delayed by the delay circuit 40 by the amount of the voltage phase shift (phase difference) Φ associated with input impedance of the comparator of the signal converter circuit 38, and then the signal is inputted into a spectrum analyzer 46. The operating voltage signal is inputted into the spectrum analyzer 46 as an external trigger signal, and in response to the external trigger signal, partial discharge signals detected by the antenna 28a are sequentially inputted into the spectrum analyzer 46 and are scanned by the spectrum analyzer 46 in synchronization with the operating voltage phase. Then, by executing phase domain analysis to detect the partial discharge signal by the spectrum analyzer 46, it is possible to highly accurately detect the pattern of partial discharge with regard to the operating voltage phase.

In this embodiment, if a voltage phase shifts by the amount of the phase difference Φ during the process in which the operating voltage signal is inputted into the spectrum analyzer 46, the phase of the operating voltage signal is delayed by the amount of the phase difference Φ. Therefore, it is possible to highly accurately detect the pattern of partial discharge with regard to the operating voltage phase.

Figure 5:
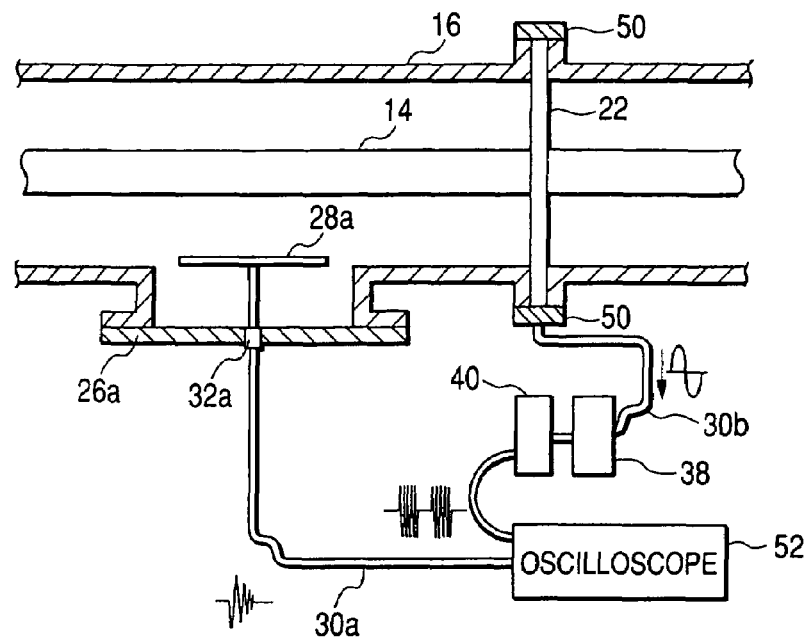
FIG. 5 is a block diagram of a partial discharge measuring device according to a third embodiment of the present invention.

Next, a third embodiment of the present invention will be explained with reference to FIG. 5. In this embodiment, instead of using an antenna 28b as a voltage sensor, an electromagnetic wave sensor 50 which is disposed around the insulating support medium 22 and detects an operating voltage applied to the high-voltage conductor 14 is used, and instead of using a spectrum analyzer 46, an oscilloscope 52 is used. The other configuration is the same as that shown in FIG. 4. This embodiment uses an oscilloscope 52 as a measuring instrument which displays input information on its screen. Accordingly, a coaxial cable 30a is connected to a measurement signal input terminal of the oscilloscope 52, and a coaxial cable 30b is connected to a trigger signal input terminal of the oscilloscope 52.

In this embodiment, the operating voltage signal detected by an electromagnetic wave sensor 50 functions as a trigger, and partial discharge signals detected by an antenna 28a are sequentially displayed on the screen of the oscilloscope 52. In this case, because the operating voltage signal is delayed in the delay circuit 40 by the amount of the phase shift (phase difference) Φ, it is possible to detect the partial discharge signal using the zero cross of the operating voltage as a trigger position. As a result, it is possible to synchronize the operating voltage with the partial discharge signal.

In this embodiment, phase difference Φ is compensated by the delay circuit 40. Therefore, the operating voltage can be synchronized with the partial discharge signal, thereby making it possible to highly accurately measure the partial discharge signal.

Figure 6:
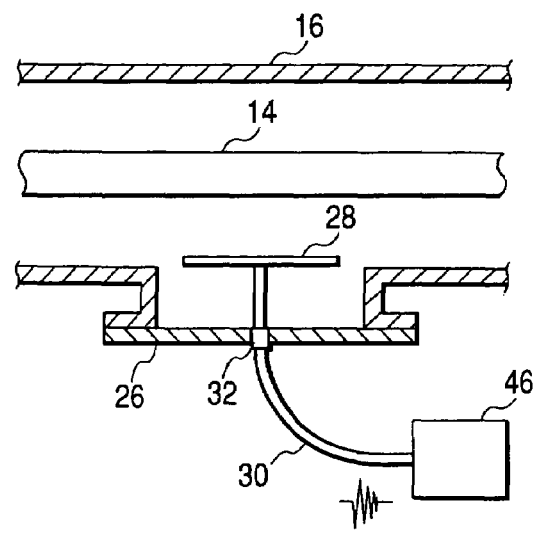
FIG. 6 is a block diagram of a partial discharge measuring device according to a fourth embodiment of the present invention.

Next, a fourth embodiment of the present invention will be explained with reference to FIG. 6. In this embodiment, a coaxial cable 30 which is connected to an antenna 28 is directly connected to a spectrum analyzer 46, and the spectrum analyzer 46 measures the partial discharge signal detected by the antenna 28. The other configuration is the same as that shown in FIG. 1.

Figure 7:
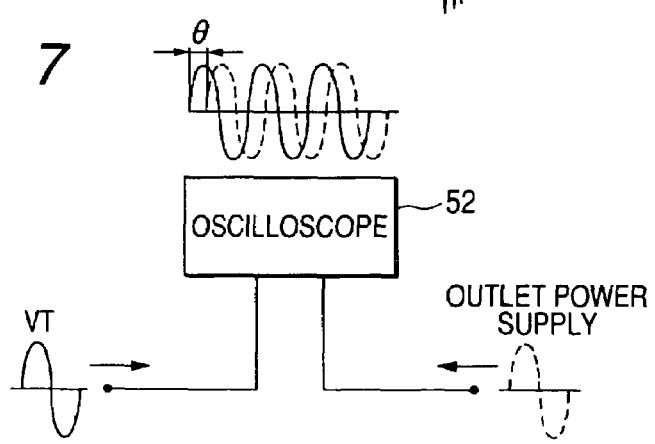
FIG. 7 is an explanatory drawing showing the configuration in which a phase difference is obtained by using an oscilloscope.

In this embodiment, as shown in FIG. 7, for example, an oscilloscope 52 is used to measure phase difference θ between the power supply voltage of the spectrum analyzer 46 and the operating voltage signal applied to the high-voltage conductor 14, and based on the measured phase difference θ, the position of the time axis displayed on the screen of the spectrum analyzer 46 is compensated so that the phase difference θ becomes 0. After that, the voltage detected by the antenna 28 is inputted into the spectrum analyzer 46, and based on the inputted voltage, partial discharge information is displayed on the screen. Consequently, partial discharge can be accurately measured.

In FIG. 7, to detect an operating voltage signal, for example, the VT (Voltage Transfer) can be used for measurement. When measuring a power supply voltage of the spectrum analyzer 46, it is possible to measure the phase of the power supply voltage by connecting the spectrum analyzer 46 and the oscilloscope 52 to the same power supply.

In this embodiment, prior to the measurement of partial discharge by the spectrum analyzer 46, an oscilloscope 52 is used to measure phase difference θ between the power supply voltage of the spectrum analyzer 46 and the operating voltage signal applied to the high-voltage conductor 14, and based on the measured phase difference θ, the position of the time axis displayed on the screen of the spectrum analyzer 46 is compensated so that the phase difference θ becomes 0. On the premise that the compensation has been completed, the voltage detected by the antenna 28 is inputted into the spectrum analyzer 46, and based on the inputted voltage, partial discharge information is displayed on the screen. As a result, partial discharge can be accurately measured.

What is claimed is:

1. A method of measuring partial discharge, comprising the steps of:

detecting a voltage of a conductor encased in a container together with an insulation material by a voltage sensor;

detecting an operating voltage supplied to said conductor based on said detected voltage of said conductor;

transmitting the operation voltage detected by said voltage sensor to a measuring instrument through a signal converter circuit;

compensating an original phase difference θ between the power supply voltage of said measuring instrument and said detected operating voltage which is transmitted into said measuring instrument through said signal converter circuit, and a phase shift Φ caused by said signal converter circuit;

determining the phase of the time axis to be displayed on a screen of said measuring instrument based on said compensated operating voltage;

displaying said determined phase of the time axis in the screen of said measuring instrument;

displaying said detected partial discharge on said phase of the time axis in the screen of said measuring instrument;

detecting said partial discharge through an electric cable which bypasses said signal converter circuit and reaches said measuring instrument; and displaying said partial discharge transmitted through said electric cable to said measuring instrument on said time axis on the screen of said measuring instrument which is compensated by said phase difference θ and said phase shift Φ.

2. The method of measuring partial discharge according to claim 1, wherein: said phase shift Φ is caused by an input impedance in said signal converter circuit.

3. The method of measuring partial discharge according to claim 1, wherein: said phase shift Φ is caused by an input impedance of a comparator in said signal converter circuit.

4. A partial discharge measuring system comprising; a conductor encased in a container together with an insulation material;

a voltage sensor which detects the voltage of said conductor;

an operating voltage detecting means for detecting an operating voltage of said conductor in which an operating voltage in the output voltage of said voltage sensor passes through a signal converter circuit and reaches a measuring instrument;

a display means with a screen in said measuring instrument;

a phase compensating means for compensating an original phase difference θ between the power supply voltage of said measuring instrument and said operating voltage which is transmitted into said measuring instrument through said signal converter circuit, and a phase shift Φ caused by said signal converter circuit;

a time axis displaying means for displaying the phase of the time axis based on said compensated operating voltage on said screen;

a partial discharge detecting means for detecting the partial discharge of said conductor based on said detected voltage of said conductor;

an electric cable for bypassing said signal converter circuit and connecting said voltage sensor and said measuring instrument; and a partial discharge displaying means for displaying said detected partial discharge on the phase of said time axis on said screen of said measuring instrument.

5. The partial discharge measuring system according to claim 4, wherein: said phase shift Φ is caused by an input impedance in said signal converter circuit.

6. The partial discharge measuring system according to claim 4, wherein: said phase shift Φ is caused by an input impedance of a comparator in said signal converter circuit.

7. The partial discharge measuring system according to claim 4, wherein said signal converter circuit further comprises:

a comparator which responds to said operating voltage detected by said voltage sensor and converts the waveform of said operating voltage to a square-wave, a half-wave rectification circuit which half-wave rectifies the square-wave outputted by said comparator, and an oscillation circuit which converts an output voltage of said half-wave rectification circuit into a voltage of higher frequency than that of said operating voltage.

8. The partial discharge measuring system according to claim 4, wherein:

said measuring instrument comprises a spectrum analyzer.

9. The partial discharge measuring system according to claim 4, wherein:

said measuring instrument comprises an oscilloscope.

10. The partial discharge measuring system according to claim 4, wherein:

said container is connected to a switchgear encasing container which encases a gas insulated switchgear, and said conductor is connected to an electrode of said gas insulated switchgear.

* * * * *